United States Patent
Breitwisch et al.

(10) Patent No.: US 7,880,194 B2
(45) Date of Patent: Feb. 1, 2011

(54) CROSS POINT SWITCH USING PHASE CHANGE MATERIAL

(75) Inventors: Matthew J. Breitwisch, Yorktown Heights, NY (US); Chung H. Lam, Peekskill, NY (US); Prabhakar Kudva, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 463 days.

(21) Appl. No.: 12/106,539

(22) Filed: Apr. 21, 2008

(65) Prior Publication Data

US 2009/0189731 A1 Jul. 30, 2009

(51) Int. Cl.
*H01L 29/66* (2006.01)
(52) U.S. Cl. .......................... 257/108; 257/2
(58) Field of Classification Search .............. 337/189, 337/283; 257/2, 108
See application file for complete search history.

(56) References Cited

U.S. PATENT DOCUMENTS 7,511,532 B2 * 3/2009 Derharcobian et al. ........ 326/41

2006/0092694 A1 5/2006 Choi ........................ 365/163
2006/0102927 A1 5/2006 Fujita ........................ 257/130
2007/0235784 A1 10/2007 Krusin-Elbaum ........... 257/296

FOREIGN PATENT DOCUMENTS

EP 1688958 5/2006

OTHER PUBLICATIONS

PCT International Search Report and Written Opinion for International Application No. PCT/EP2009/053625 , pp. 1-11 (Aug. 24, 2009).

* cited by examiner

*Primary Examiner*—Douglas M Menz
(74) *Attorney, Agent, or Firm*—Ido Tuchman; Vazken Alexanian

(57) ABSTRACT

A cross-point switch and cross-point switch fabric utilizing phase change material, and method of operating the same. The cross-point switch includes a phase change cross-point circuit containing a plurality of terminal nodes connected to a central node. The connections between the terminal nodes and the central nodes are regulated by phase change switches comprised of a phase change material. The phase change switches being controlled by heating elements capable of melting or crystallizing the phase change material in the phase change switch. The heating elements are operated by a separate heating circuit. Each individual heating element is regulated by an individual transistor.

20 Claims, 4 Drawing Sheets

CROSS POINT SWITCH USING PHASE CHANGE MATERIAL

BACKGROUND OF THE INVENTION

1. Field of the Invention

The present invention relates to cross-point switches and more particularly the application of phase change switches to cross-point switches.

2. Description of Background

Three major types of reconfigurable logic and circuit fabrics are transistor based cross-point switches, fuse based cross-point switches, and anti-fuse based cross-point switches. The transistor based cross-point switches can be reprogrammed multiple times, whereas the fuse based and the anti-fuse based cross-point switches are typically only one time reprogrammable.

Conventional transistor based cross-point switches require wiring each individual terminal node in a cross-point switch to another individual terminal node in the cross-point switch. Additionally, each pair of terminal nodes requires an individual switch assigned to regulate the connection between the pair of terminal nodes. Current transistor based cross-point switch requires, $$\sum_{k=1}^{n-1} k$$

connections/transistor switches, where n is the number of terminal nodes in the transistor cross-point switch. Thus, the number of "moving parts" and overall resistance of the cross-point switch is greatly increased with each additional terminal node.

Fuse based reconfiguration technology presently relies on several methods to make ("fuse") or break ("antifuse") electrical connections in fabricated structures. For example, laser-fusible links represent an early approach, which are now replaced by electrical techniques entirely internal to the chip. In addition, electro-migration fuses (such as in IBM's eFUSE technology for rerouting chip logic), are currently in use. An electro-migration fuse takes up a relatively large area and requires a high current to blow the fuse. Also, an electro-migration fuse is "one-shot" (as stated above) in that once the fuse is blown, it cannot be returned to a conducting state. Furthermore, the variation of eFUSE characteristics is relatively broad, thus requiring that the state of each fuse to be sensed by a discriminating circuit with the digital result stored in a latch. The blowing of an electro-migration fuse is also relatively slow. Additionally, similar to the current transistor-based cross-point switches often require a fuse region for each pair of terminal nodes.

Anti-fuse approach (e.g., used for some DRAM repair operations) typically involves a very thin dielectric material such as silicon dioxide, or a sandwich combination of silicon oxide-nitride-oxide (ONO), between two conductors. Anti-fuse programming is performed by applying a relatively high voltage through the conducting terminal. This causes dielectric breakdown in the dielectric so that the resistance of the anti-fuse permanently changes from high to low. This is also a one-shot technique requiring high voltage, as mentioned above. Again, similar to the current transistor-based cross-point switches often require an anti-fuse region for each pair of terminal nodes.

Unfortunately, the existing controllable link technologies described above may not have optimal properties for future microchip generations, due to factors such as: excessive area taken up by the fuse, "sunsetting" of the non-standard high voltages/currents which may be required by fuse programming, the desirability of "multishot" reprogrammable fuses, and insufficient speed relative to application specific integrated circuit (ASIC) designs.

Accordingly, it would therefore be desirable to provide a reprogrammable cross-point switch suitable with performance similar to ASIC designs.

SUMMARY OF THE INVENTION

One exemplary aspect of the invention is a phase change cross-point switch for routing electrical signals from an input node to at least one output node. The phase change cross-point switch includes a central node and a plurality of phase change switches. Each phase change switch includes two switch nodes, with one of the two switch nodes being electrically coupled to the central node. Each phase change switch is substantially electrically conductive in a crystalline phase and substantially electrically non-conductive in an amorphous phase. The phase change cross-point switch further includes a plurality of heating elements, with each heating element paired with and proximate one of the phase change switches. Each heating element is controllable to change the phase change switch it is paired with from the crystalline phase to the amorphous phase and vice-versa. Moreover, the heating elements are controllable independent of current passing through the switch nodes.

In one particular embodiment of the invention, each individual heating element is regulated by an individual transistor. The transistors regulate the current flow to each individual heating element such that an individual heating element can be tuned to a specific temperature, thereby melting or crystallizing the phase change material.

Another exemplary aspect of the invention is a cross-point switch fabric for routing electrical signals from an input node to at least one output node. The phase change cross-point switch fabric comprises a plurality of interconnected phase change cross-point switches. Each a phase change cross-point switch includes a central node and a plurality of phase change switches. Each phase change switch includes two switch nodes, with one of the two switch nodes being electrically coupled to the central node. Each phase change switch is substantially electrically conductive in a crystalline phase and substantially electrically non-conductive in an amorphous phase. The phase change cross-point switch further includes a plurality of heating elements, with each heating element paired with and proximate one of the phase change switches. Each heating element is controllable to change the phase change switch it is paired with from the crystalline phase to the amorphous phase and vice-versa. Moreover, the heating elements are controllable independent of current passing through the switch nodes.

Yet another exemplary aspect of the invention is a method for routing a signal through a phase change cross-point switch having a plurality of nodes from an input node to at least one output node. The method includes activating a plurality of heating elements paired with a plurality of phase change switches. Each phase change switch includes two switch nodes, with one of the two switch nodes being electrically coupled to a central node. Each phase change switch is substantially electrically conductive in a crystalline phase and substantially electrically non-conductive in an amorphous phase, wherein the plurality of heating elements are activated independently of current passing through the switch nodes. A deactivating operation deactivates the plurality of heating elements such that the plurality of phase change switches is substantially electrically non-conductive. An activating operation activates an input heating element paired with an input phase change switch, with one of the switch nodes of the input phase change switch being the input node. Another deactivating operation deactivates the input heating element such that the input phase change switch is substantially electrically conductive. Another activating operation activates an output heating element paired with an output phase change switch, with one of the switch nodes of the output phase change switch being the output node. A further deactivating operation deactivates the output heating element such that the output phase change switch is substantially electrically conductive.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION OF THE INVENTION

The present invention is described with reference to embodiments of the invention. Throughout the description of the invention reference is made to FIGS. 1-3.

As described in detail below, an aspect of the present invention is a phase change cross-point switch that utilizes phase change switches and heating elements. A variety of phase change materials may be utilized for the phase change switches, such as Germanium-Antimony-Tellurium (GST). By utilizing phase change switches in a cross-point switch the number of inter-nodal connections necessary for operation can be reduced. For example, as stated above, current transistor based cross-point switch requires, $$\sum_{k=1}^{n-1} k$$

connections/transistor switches, where n is the number of terminal nodes in the transistor cross-point switch. Alternatively, the phase change cross-point switch requires only n connections/phase change switches, where n is the number of terminal nodes in the phase cross-point switch. Any phase change cross-point switch containing greater than 3 terminal nodes will have fewer connections/switches than a transistor cross-point switch with the same number of terminal nodes. By reducing the number of connections/switches in the phase change cross-point switch the resistance in the phase change cross-point switch is also reduced.

Figure 1:
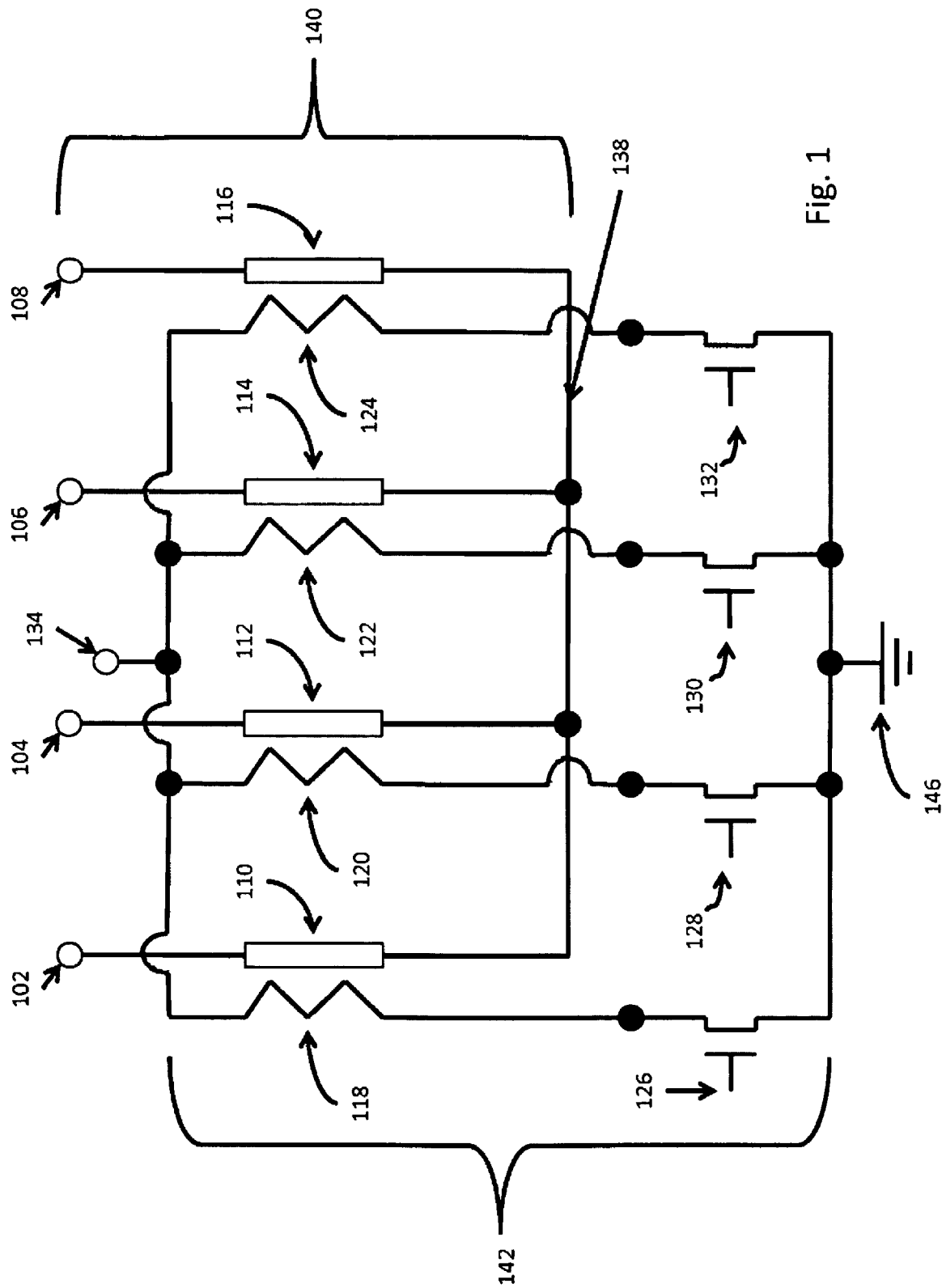
FIG. 1 illustrates a schematic for a phase change cross-point switch.

In FIG. 1, a schematic of an exemplary embodiment of the phase change cross-point switch with four terminal nodes is shown. The phase change cross-point switch is comprised of a phase change cross-point circuit 140 and a heating circuit 142. The phase change cross-point circuit 140 is comprised of the terminal nodes 102, 104, 106, 108 wired to the phase change switches 110, 112, 114, 116. The phase change switches are wired to a central node 138. In this exemplary embodiment of the invention, the central node 138 is comprised of the wiring connecting the phase change switches 110, 112, 114, 116. The phase change switches 110, 112, 114, 116 allow or prevent substantial current from flowing from one terminal node 102, 104, 106, 108 to another terminal node 102, 104, 106, 108. An individual phase change switch 110, 112, 114, 116 in an amorphous phase will have relatively high resistance and prevent current from flowing to the wired terminal node 110, 112, 114, 116. An individual phase change switch 110, 112, 114, 116 in a crystalline phase will have relatively low resistance and allow substantial current to flowing to the wired terminal node 110, 112, 114, 116.

In one particular embodiment of the invention, the phase change cross-point circuit 140 is wired in series from one terminal node 102, 104, 106, 108 to another terminal node 102, 104, 106, 108. In an alternate embodiment of the invention, the phase change cross-point circuit 140 is wired in parallel from one terminal node 102, 104, 106, 108 to another terminal node 102, 104, 106, 108. Note that different embodiments of the invention may contain a greater or lesser number of terminal nodes 102, 104, 106, 108. As described above, the number of phase change switches is in one-to-one correspondence with the number of terminal nodes.

In a further embodiment of the cross-point switch, at least two phase change switches are electrically coupled in series circuit to the central node 138. This switch configuration can be utilized to increase the electrical resistance of the signal path. In an alternate or additional configuration of the cross-point switch, at least two phase change switches are electrically coupled in parallel circuit to the central node 138. Such a switch configuration can be utilized to decrease the electrical resistance of the signal path.

Also shown in FIG. 1, the heating circuit 142 is used to operate the phase change cross-point circuit 140. Heating elements 118, 120, 122, 124 are paired to individual phase change switches 110, 112, 114, 116 such that heating element 118 is paired to the phase change switch 110, heating element 120 is paired to the phase change switch 112, heating element 122 is paired to the phase change switch 114, and heating element 124 is paired to the phase change switch 116. Note that the number of heating elements is in one-to-one correspondence with the number of phase change switches.

The heating elements 118, 120, 122, 124 employ high-resistance materials which cause ohmic heating when current is applied. These materials include, but are not limited to, polycrystalline silicon, P-type amorphous silicon, tantalum silicon nitrite, and titanium nitride. Each individual heating element 118, 120, 122, 124 alters the phase of the paired phase change switch 110, 112, 114, 116. The heating elements 118, 120, 122, 124 can change the phase change switches 110, 112, 114, 116 to the amorphous phase by heating the phase change material in the phase change switches 110, 112, 114, 116 to a melting point then quickly cooling off so that the phase change material "quenches" before the phase change material can crystallize and settles in the amorphous phase. The heating elements 118, 120, 122, 124 change the phase change switches 110, 112, 114, 116 to the crystalline phase by heating the phase change material in the phase change switches 110, 112, 114, 116 to a crystallization point so that the phase change material will crystallize and settle in the crystalline phase.

In this exemplary embodiment of the invention, the heating elements 118, 120, 122, 124 are wired to a common voltage source 134 and to a common ground 136. Additionally, the external heater 118 is wired to a transistor 126, the external heater 120 is wired to a transistor 128, the external heater 122 is wired to a transistor 130, and the external heater 124 is wired to a transistor 132.

In one particular embodiment of the invention, the heating elements 118, 120, 122, 124 and the transistors 126, 128, 130, 132 are wired in parallel in the external heating circuit 142. By wiring the heating elements 118, 120, 122, 124 and transistors 126, 128, 130, 132 in parallel, the overall resistance of the external heating circuit 142 is significantly less than the overall resistance of an external heating circuit wired in series.

In one embodiment of the invention, the common voltage source 134 is set to a voltage great enough so that the heating elements 118, 120, 122, 124 can melt the phase change material in the phase change switches 110, 112, 114, 116. In an alternate embodiment of the invention, the voltage setting for the common voltage source 134 is adjusted to the voltage necessary for the heating elements 118, 120, 122, 124 to melt or crystallize the phase change material in the phase change switches 110, 112, 114, 116.

Figure 2:
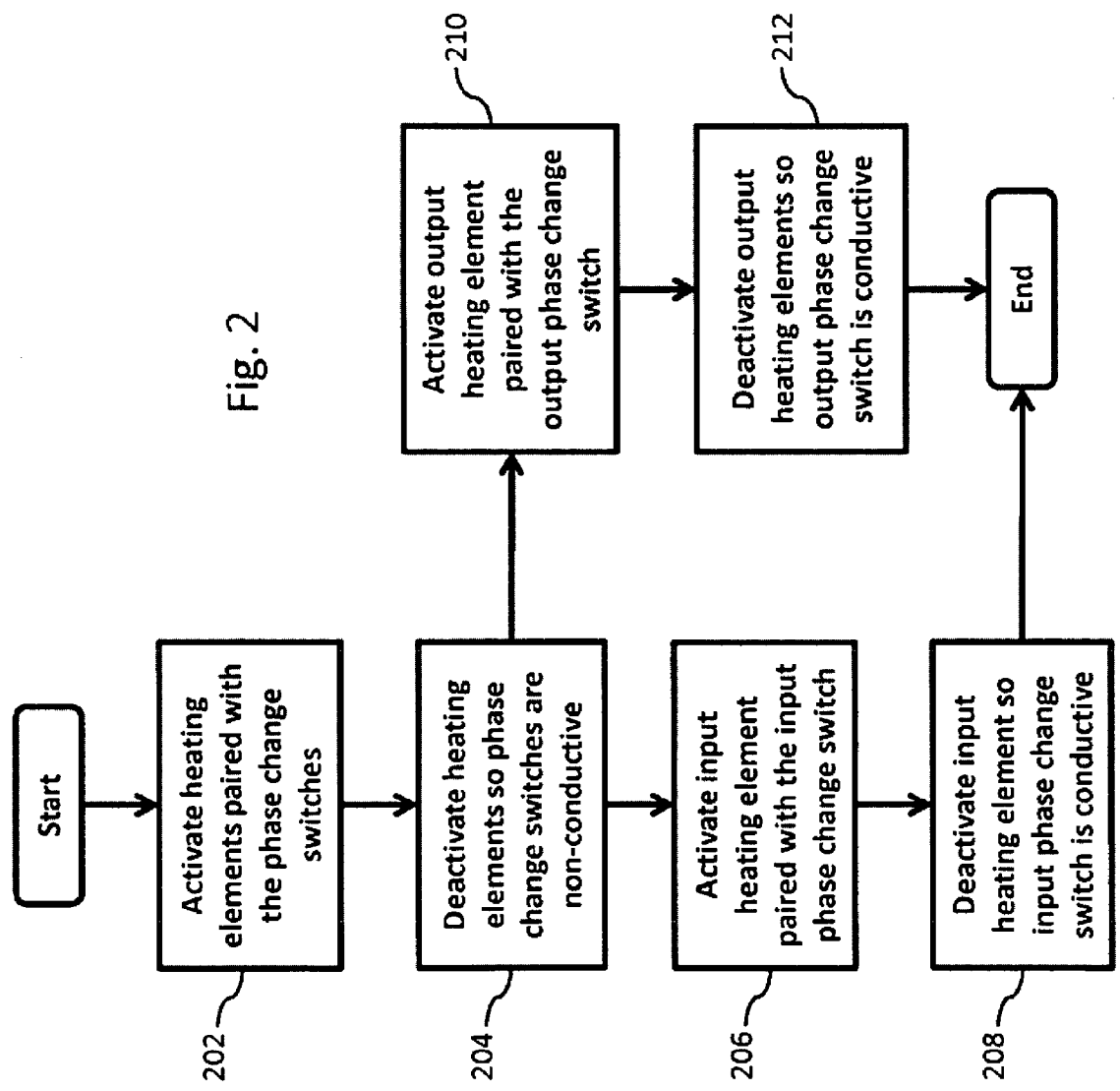
FIG. 2 shows one embodiment for operating the cross-point switch in accordance with the present invention.

FIG. 2 illustrates one embodiment of the invention for operating the cross-point switch. Operation of the cross-point switch allows a signal to be routed from an input node to at least one output node. The operations depicted in FIG. 2 can be implemented in software, firmware, hardware or some combination thereof. Program code logic may be stored in a storage medium, loaded into and/or executed by a computer, wherein, when the program code logic is loaded into and executed by a computer, the computer becomes an apparatus for practicing the invention. Examples of storage medium include solid state memory (RAM or ROM), floppy diskettes, CD-ROMs, hard drives, universal serial bus (USB) flash drives, or any other computer-readable storage medium.

At activating operation 202, initial phase change cross-point switch programming begins. During this operation, each heating element 118, 120, 122, 124 paired with a phase change switch is activated by applying an activation current through the heating element such that the heating element is elevated to a temperature sufficient to melt a phase change material in the phase change switches. In a particular embodiment, the common voltage source 134 is set at 5V. All the transistors 126, 128, 130, 132 are set to 5V, which allows the heating elements 118, 120, 122, 124 to heat the phase change material in the phase change switches 110, 112, 114, 116 to a melting point, 800° C. (the actual melting point temperatures are dependent on the phase change material used). After activating operation 202 is completed, control passes to deactivating operation 204.

At deactivating operation 204, the plurality of heating elements 118, 120, 122, 124 are deactivated such that the plurality of phase change switches is substantially electrically non-conductive. In accordance with one particular embodiment of the invention, the transistors 126, 128, 130, 132 are then quickly set to 0V so that the heating elements 118, 120, 122, 124 are turned off and the phase change material in the phase change switches 110, 112, 114, 116 are quickly cooled and settle in the amorphous phase. As described above, the amorphous phase has a relatively high electrical resistance so that current generally cannot pass from terminal node 102, 104, 106, 108 to terminal node 102, 104, 106, 108. After deactivating operation 204 is completed, control passes to activating operations 206 and 210.

At activating operations 206 and 210, input heating element and output heating element(s) are activated. The input heating element is the heating element paired with the phase change switch containing the input node. Conversely, the output heating element is the heating element paired with the phase change switch containing the output node.

Activating the input heating element and the output heating element(s) comprises applying an activation current through the input heating element such that the heating elements are elevated to a temperature sufficient to recrystallize a phase change material in the associated phase change switches. For example, in accordance to one particular embodiment of the invention, if terminal node 102 (input node) and terminal node 104 (output node) need to be connected, the common voltage source 134 is set to 5V. Transistor 126 and transistor 128 are set to 2.5V so that input heating element 118 and output heating element 120 heat input phase change switch 110 and output phase change switch 112 to a crystallization point, 450° C. (again, the actual crystallization temperatures are dependent on the phase change material).

After activating operations 206 and 210 are performed, processing passes to deactivating operations 208 and 212. At deactivating operations 208 and 212, the input and output heating elements are deactivated such that the input and output phase change switches are substantially electrically conductive. In particular, quenching the activation current at the input and output heating elements is performed such that the phase change material in the input and output phase change switches cools to a crystalline phase. Continuing the example above, transistors 126 and 128 are set to 0V when the phase change material in phase change switches 110 and 112 has crystallized, thereby turning off heating elements 118 and 120. The crystalline phase of the phase change material in phase change switches 110 and 112 allows a signal to flow from terminal node 102 to terminal node 104 (and vice versa). Note that connections can be made to multiple terminal nodes 102, 104, 106, 108 simultaneously.

Figure 3:
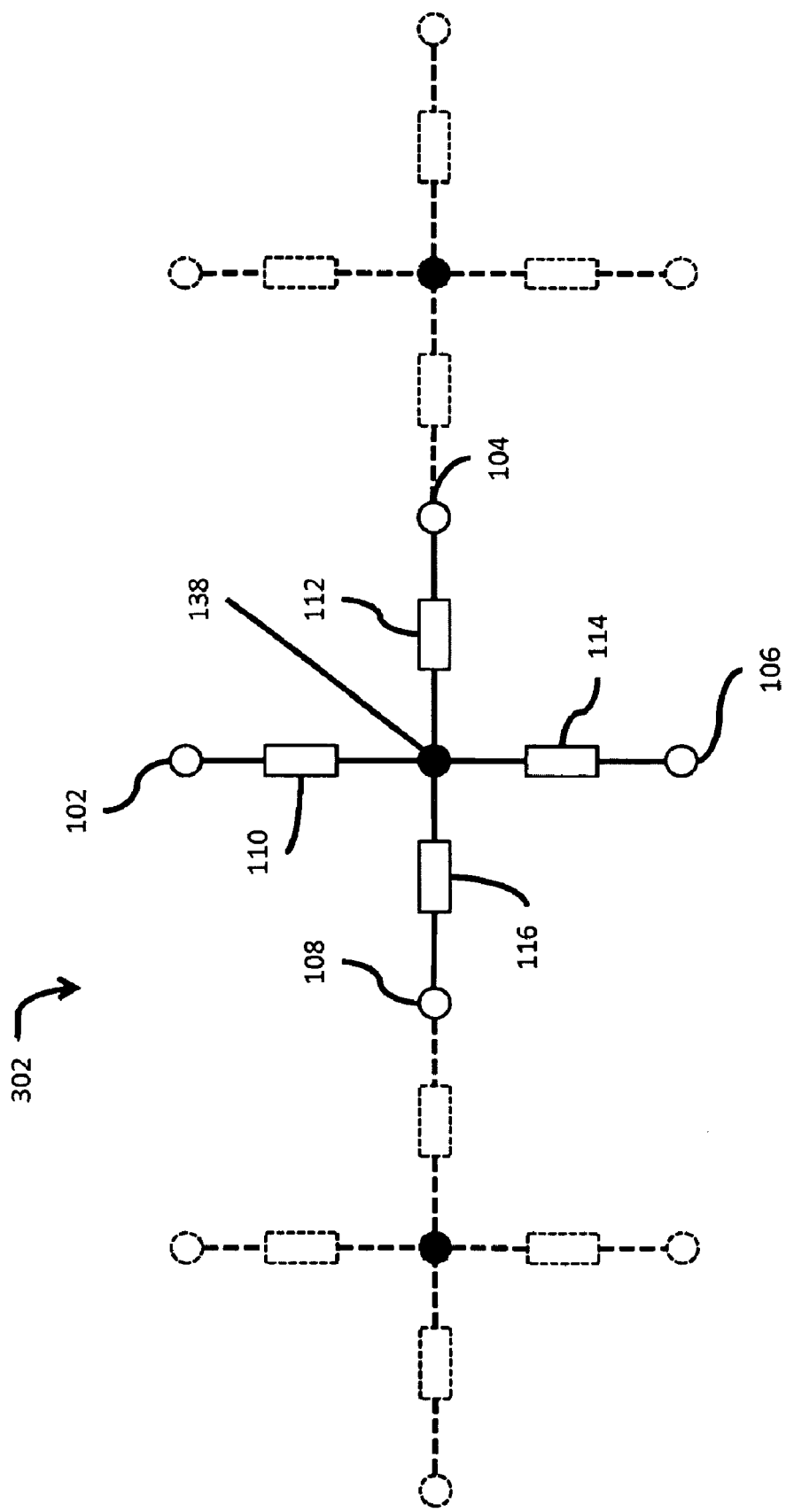
FIG. 3 illustrates a cross-point switch fabric for routing electrical signals from an input node to at least one output node.

Turning to FIG. 3, a cross-point switch fabric 302 for routing electrical signals from an input node to at least one output node is shown. The cross-point switch fabric includes a plurality of a plurality of interconnected phase change cross-point switches.

The terminal nodes 102, 104, 106, 108 are wired to the phase change switches 110, 112, 114, 116. The phase change switches 110, 112, 114, 116 are wired to the central node 138. Not shown in this figure is the external heating circuit 142, including the heating elements 118, 120, 122, 124 positioned proximate the phase change switches 110, 112, 114, 116 and the transistors 126, 128, 130, 132 for activating the heating elements 118, 120, 122, 124 as described above. In this particular embodiment of the invention, the central node is a connected cross-point between 2 wires or connections.

Figure 4:
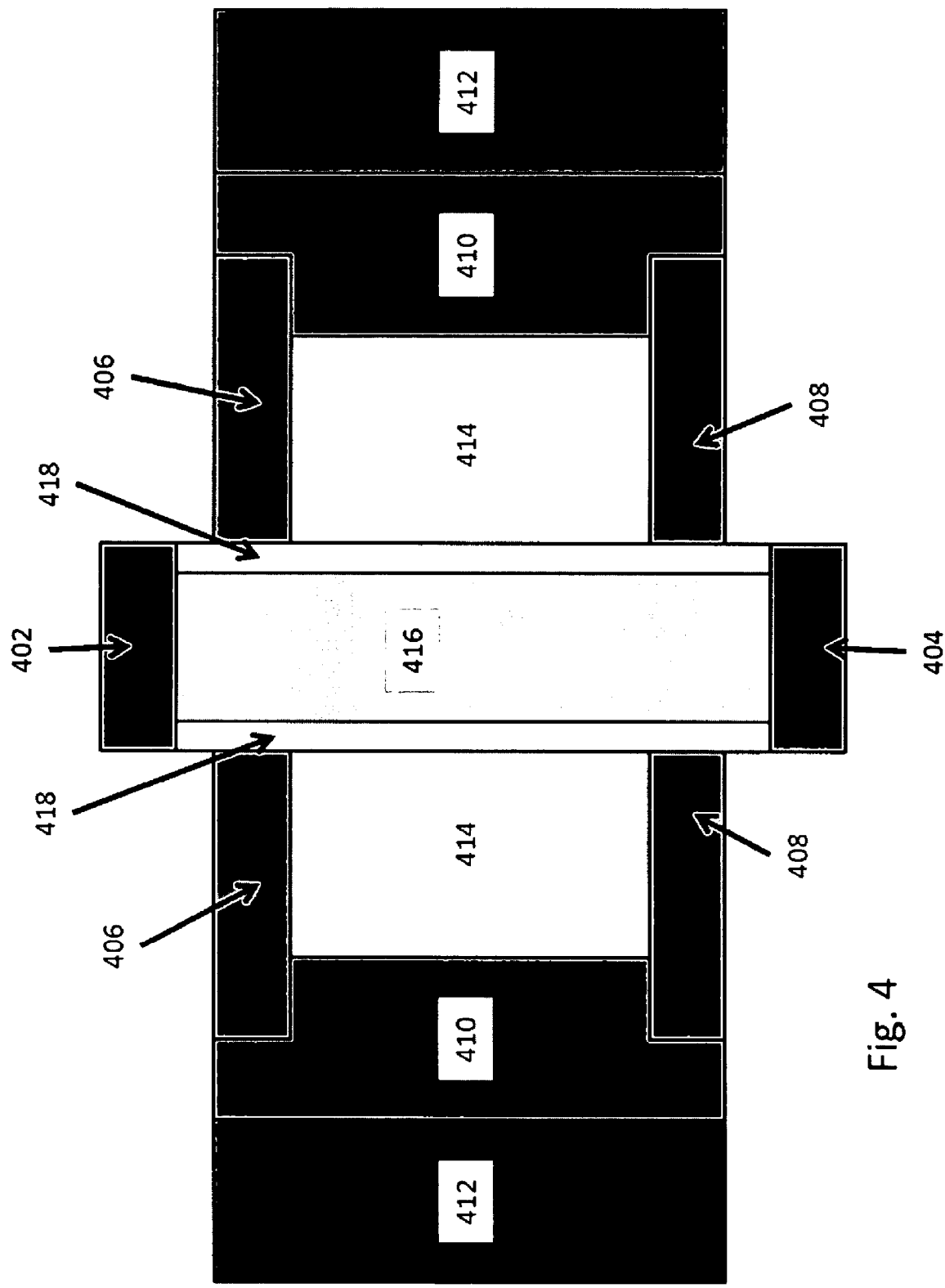
FIG. 4 illustrates a phase change switch and a paired external heater.

FIG. 4 illustrates, in one particular embodiment of the invention, the structure of a phase change switch and heating element pair in the phase change cross-point switch. The phase change cross-point switch is comprised of a common voltage source connection 402, a common ground connection 404, an "in" connection 406 (to the terminal node), an "out" connection 408 (to the central node), a thermal/electrical insulator material layer 410, a low-K dielectric material layer 412, the phase change switch 414, the heating element 416, and a thin electric insulating layer 418. Note that the common voltage source connection 402 and the common ground connection 404 may be interchanged. Additionally, the "in" connection 406 and the "out" connection 408 may also be interchanged.

In one particular embodiment of the invention, structure formation begins by creating a large via in a low-K dielectric material layer 412 and forming the thermal/electric insulator material layer 410 in the large via. Those skilled in the art will recognize a variety of processes capable of forming the large via and depositing the thermal/electric insulator material layer 410 in the low-K dielectric material layer 412. These processes can be, but are not limited to, photolithography and reactive ion etches to create the large via, and a plasma-enhanced chemical vapor deposition (PECVD) for depositing the thermal/electric insulator material layer 410. Additionally processes such as a chemical mechanical polish (CMP) may be performed to remove excess thermal/electric insulator material. The low-K dielectric material layer 412 can be comprised of any low-K dielectric material such as porous silicon dioxide, and the thermal/electric insulator material layer 410 can be comprised of any thermal/electric insulator material such as silicon carbonitride. The thermal/electric insulator material should isolate electrical current and phase change heating to the phase change switch 414.

A via is formed in the thermal/electric insulator material layer 410 and the phase change switch 414 is formed in the via formed in the thermal/electric insulator material layer 410. Again, those skilled in the art will recognize a variety of processes capable of forming the via such as photolithography and RIE, and forming the phase change switch 414 such as chemical vapor deposition (CVD). Again, a CMP may be performed to remove excess material. The phase change switch 414, as stated above, is comprised of a phase change material capable of settling in an amorphous state and a crystalline state. Phase change materials such as, but not limited to, Germanium-Antimony-Tellurium (GST) can be utilized for the phase change switch 414. Note that the amount of phase change material used for the phase change switch 414 is relatively large in comparison to the amount of phase change material is normally used for other phase change application such as phase change memory (PCM). A greater volume of phase change material helps reduce the resistance in the phase change switch 414 when in the crystalline phase.

A small via is formed in the phase change switch 414 and the thin electric insulating layer 418 and the heating element 416 are formed in the small via. The thin electric insulating layer 418 is formed so that electrical flow does not leak from the external heating circuit to the phase change cross-point circuit and vice versa. Those skilled in the art will recognize the processes required in forming the small via. In one particular embodiment of the invention, an insulating material such as, but not limited to, silicon dioxide in the small via. Then a photolithographic mask is applied and a RIE is performed to form the thin electric insulating layer 418 lining the walls of the small via. The photolithographic mask is then stripped and a conductive heating material such as, but not limited to, Tantalum-Silicon-Nitride (TaSiN) is formed in the small via. Processes such as CVD or metal sputter deposition can be performed to form the heating element 416 comprised of conductive heating material. A metal clean and CMP may be performed to remove excess conductive heating material and excess insulating material.

Finally, the common ground connection 404 is formed connecting to the common ground (not shown) and to one end of the heating element 416. The common voltage source connection 402 is formed connecting to the common voltage source (not shown) and to the other end of the heating element 416. The "in" connection 406 is formed connecting to the terminal node (not shown) and to one end of the phase change switch 414. The "out" connection 408 is formed connecting to the central node (not shown) and to the other end of the phase change switch 414. A conductive material such as, but not limited to, tungsten (W) or copper (Cu) can be used to form the common ground connection 404 and the common voltage source connection 402. Those skilled in the art will recognize that a variety of processes may be utilized in forming a common ground connection 404 and a common voltage source connection 402.

Having described preferred embodiments for the phase change material cross-point switch (which are intended to be illustrative and not limiting), it is noted that modifications and variations can be made by persons skilled in the art in light of the above teachings. It is therefore to be understood that changes may be made in the particular embodiments disclosed which are within the scope and spirit of the invention as outlined by the appended claims. Having thus described aspects of the invention, with the details and particularity required by the patent laws, what is claimed and desired protected by Letters Patent is set forth in the appended claims.

What is claimed is:

1. A phase change cross-point switch for routing electrical signals from at least one input node to at least one output node, the phase change cross-point switch comprising:
   a central node;
   a plurality of phase change switches, each phase change switch including two switch nodes, one of the two switch nodes being electrically coupled to the central node, each phase change switch being substantially electrically conductive in a crystalline phase and substantially electrically non-conductive in an amorphous phase; and
   a plurality of heating elements, each heating element being paired with and proximate one of the phase change switches, each heating element being controllable to change the phase change switch it is paired with from the crystalline phase to the amorphous phase and vice-versa;
   wherein the heating elements are controllable independent of current passing through the switch nodes.

2. The phase change cross-point switch of claim 1, wherein the phase change switches are comprised of a phase change material.

3. The phase change cross-point switch of claim 1, wherein the heating elements are electrically coupled in parallel to a common voltage source.

4. The phase change cross-point switch of claim 3, wherein each heating element is electrically coupled to an individual transistor regulating current to the heating element.

5. The phase change cross-point switch of claim 1, further comprising at least two phase change switches electrically coupled in series circuit to the central node.

6. The phase change cross-point switch of claim 1, further comprising at least two phase change switches electrically coupled in parallel circuit to the central node.

7. A cross-point switch fabric for routing electrical signals from an input node to at least one output node, the phase change cross-point switch fabric comprising:
   a plurality of interconnected phase change cross-point switches, each phase change cross-point switch comprising:
      a central node;
      a plurality of phase change switches, each phase change switch including two switch nodes, one of the two switch nodes being electrically coupled to the central node, each phase change switch being substantially electrically conductive in a crystalline phase and substantially electrically non-conductive in an amorphous phase; and a plurality of heating elements, each heating element being paired with and proximate one of the phase change switches, each heating element being controllable to change the phase change switch it is paired with from the crystalline phase to the amorphous phase and vice-versa;

wherein the heating elements are controllable independent of current passing through the switch nodes.

8. The cross-point switch fabric of claim 7, wherein the phase change switches are comprised of a phase change material.

9. The cross-point switch fabric of claim 7, wherein the heating elements are electrically coupled in parallel to a common voltage source.

10. The cross-point switch fabric of claim 9, wherein each heating element is electrically coupled to an individual transistor regulating current to the heating element.

11. The cross-point switch fabric of claim 7, further comprising at least two phase change switches electrically coupled in series circuit to the central node.

12. The cross-point switch fabric of claim 7, further comprising at least two phase change switches electrically coupled in parallel circuit to the central node.

13. A method for routing a signal through a phase change cross-point switch having a plurality of nodes from at least one input node to at least one output node, the method comprising:

activating a plurality of heating elements paired with a plurality of phase change switches, each phase change switch including two switch nodes, one of the two switch nodes being electrically coupled to a central node, each phase change switch being substantially electrically conductive in a crystalline phase and substantially electrically non-conductive in an amorphous phase, wherein the plurality of heating elements are activated independently of current passing through the switch nodes;

deactivating the plurality of heating elements such that the plurality of phase change switches are substantially electrically non-conductive;

activating an input heating element paired with an input phase change switch, one of the switch nodes of the input phase change switch being the input node;

deactivating the input heating element such that the input phase change switch is substantially electrically conductive;

activating an output heating element paired with an output phase change switch, one of the switch nodes of the output phase change switch being the output node; and deactivating the output heating element such that the output phase change switch is substantially electrically conductive.

14. The method of claim 13, further comprising:
wherein activating the plurality of heating elements paired with the plurality of phase change switches comprises applying an activation current through the plurality of heating elements such that the heating elements are elevated to a temperature sufficient to melt a phase change material in phase change switches; and wherein deactivating the plurality of heating elements such that the plurality of phase change switches are substantially electrically non-conductive comprises quenching the activation current at the plurality of heating elements such that the phase change material cools to an amorphous phase.

15. The method of claim 14, further comprising:
wherein activating the input heating element paired with the input phase change switch comprises applying the activation current through the input heating element such that the input heating element is elevated to a temperature sufficient to recrystallize a phase change material in the input phase change switch; and wherein deactivating the input heating element such that the input phase change switch is substantially electrically conductive comprises quenching the activation current at the input heating element such that the phase change material in the input phase change switch cools to a crystalline phase.

16. The method of claim 15, wherein activating the plurality of heating elements paired with the plurality of phase change switches includes heating the plurality of heating elements to a temperature of approximately 800° C.

17. The method of claim 16, wherein activating the input heating element paired with the input phase change switch includes heating the input heating element to a temperature of approximately 450° C.

18. The method of claim 17, wherein activating the plurality of heating elements paired with the plurality of phase change switches includes producing a voltage drop across the plurality of heating elements of approximately eight volts.

19. The method of claim 13, further comprising:
wherein activating the output heating element paired with the output phase change switch comprises applying an activation current through the output heating element such that the output heating element is elevated to a temperature sufficient to recrystallize a phase change material in the output phase change switch; and wherein deactivating the output heating element such that the output phase change switch is substantially electrically conductive comprises quenching the activation current at the output heating element such that the phase change material in the output phase change switch cools to a crystalline phase.

20. The method of claim 19, wherein activating the output heating element paired with the output phase change switch includes heating the output heating element to a temperature of approximately 450° C.

* * * * *